United States Patent [19]
Akaike et al.

[11] Patent Number: 5,673,476
[45] Date of Patent: Oct. 7, 1997

[54] ANODE BONDING METHOD FOR SELECTED REGIONS

[75] Inventors: Masatake Akaike, Atsugi; Takayuki Yagi, Yokohama; Masahiro Fushimi, Zama, all of Japan

[73] Assignee: Canon Kabushiki Kaisha, Tokyo, Japan

[21] Appl. No.: 563,906

[22] Filed: Nov. 22, 1995

Related U.S. Application Data

[63] Continuation of Ser. No. 142,094, Oct. 20, 1993, abandoned.

[30] Foreign Application Priority Data

Oct. 22, 1992 [JP] Japan .................. 4-284341

[51] Int. Cl.$^6$ ........................................ H01R 43/00
[52] U.S. Cl. .................. 29/825; 205/687; 205/78
[58] Field of Search .............. 29/825; 219/78.02; 338/4; 205/687, 78; 204/DIG. 6

[56] References Cited

U.S. PATENT DOCUMENTS

| | | | |
|---|---|---|---|
| 4,295,115 | 10/1981 | Takahashi et al. | 338/4 |
| 4,384,899 | 5/1983 | Myers | 148/1.5 |
| 4,400,869 | 8/1983 | Wilner et al. | 437/901 |
| 4,452,624 | 6/1984 | Wohltjen et al. | 65/43 |
| 4,643,532 | 2/1987 | Kleiman | 65/36 |
| 4,875,134 | 10/1989 | Kuisma | 361/282 |
| 5,024,097 | 6/1991 | Graeger et al. | 338/4 |
| 5,169,472 | 12/1992 | Goebel | 148/DIG. 135 |

FOREIGN PATENT DOCUMENTS

| | | | |
|---|---|---|---|
| 248264 | 10/1987 | Japan | 437/901 |
| 2146566 | 4/1985 | United Kingdom | 65/40 |

OTHER PUBLICATIONS

"Field Assisted Glass—Metal Sealing" by George Wallis et al.; Journal of Applied Physics; vol. No. 10, Sep. 1969; pp. 3946–3949.

Primary Examiner—P. W. Echols
Assistant Examiner—Adrian L. Coley
Attorney, Agent, or Firm—Fitzpatrick, Cella, Harper & Scinto

[57] ABSTRACT

An anode bonding method for bonding a first substrate and a second substrate, both of which have a recessed portion, includes the steps of heating the first and second substrates in a stacked state; and bonding the substrates by applying a voltage between the substrates.

13 Claims, 9 Drawing Sheets

ANODE BONDING METHOD FOR SELECTED REGIONS

This application is a continuation of application Ser. No. 08/142,094 filed Oct. 20, 1993, now abandoned.

BACKGROUND OF THE INVENTION

1. Field of the Invention

The present invention relates to an anode bonding method for bonding two substrates and an acceleration sensor obtained by using the anode bonding method.

2. Related Background Art

Hitherto, bonding of a glass substrate to a Si substrate has been generally performed by an arrangement in which a voltage of approximately 300 V is applied between the glass substrate and the Si substrate while maintaining the glass substrate at approximately 400° C., which temperature is close to the softening point of glass, as disclosed by George Wallis and Daniel I. Pomerantz in "Journal of Applied Physics, Vol. 40, No. 10, Sep. 1969: Received 2 Jan. 1969".

However, in the above-described prior art, it is difficult to anode-bond the glass substrate to a Si substrate while having to carefully select bonding and non-bonding portions of both substrates, so that the prior art has the following drawbacks.

(1) When anode bonding is performed in a state in which the bonding surfaces of a flat glass substrate and a flat Si substrate are in contact with each other when bonding a Si substrate or a glass substrate, on which a recessed portion of several μm in depth is formed carefully beforehand so as not to be bonded, to the flat glass substrate or the flat Si substrate, respectively, bonding is unavoidably caused to take place in the recessed portion which should be the above-mentioned non-bonding portion when the depth of the recessed portion is smaller than the unit length thereof.

(2) The surface of a glass substrate or a Si substrate is not completely smooth because undulations or irregularities are present when seen microscopically. Therefore, even when a recessed portion of the substrate having a depth of several μm is formed beforehand in a portion which should not be bonded, initially bonding does not always take place uniformly and simultaneously in a portion other than the recessed portion as desired. In practice, bonding is caused to take place in a portion where the clearance between the bonding surfaces is small. That is, bonding may sometimes occur unavoidably in a recessed portion, having a depth of several μm, carefully processed beforehand so as not to be bonded.

Further, when a recessed portion is formed as a non-bonding portion, initially bonding does not always take place in a portion other than the recessed portion because of the presence of undulations or irregularities. Bonding may start even in such portions as the recessed portions, where the clearance between the glass substrate and the Si substrate is small. In such a case, a bending moment is caused to take place in either the glass substrate or the Si substrate, or in both. Bonding on the surface which should primarily be bonded around the recessed portion is impeded by the bending moment. As a result, bonding is caused to take place in a portion where contact should not occur, or bonding does not occur in a portion where bonding should occur.

(3) Since bonding between a flat glass substrate and a flat Si substrate occurs in a portion in which the clearance between the bonding surfaces is small, if the bonding occurs first on the outer periphery of the bonded substrate surface, often the bonding does not occur in the central portion of the substrate surface. That is, bonding variations occur.

The following is disclosed in U.S. Pat. No. 4,384,899. When the flat surface of a Si substrate having a recessed region, i.e., a region on which a membrane is formed, and a flat surface surrounding the recessed region is anode-bonded to a glass (Pyrex glass: 7740) during manufacturing of capacitive pressure sensor elements, an electroconductive film is formed beforehand on the surface of the glass substrate facing the recessed region on the Si substrate prior to bonding. Further, a through hole is formed on the glass substrate, and then an electroconductive film is formed on the inner surface of the through hole so as to make an electrical connection to the electroconductive film on the surface of the glass substrate. Then, bonding of the membrane on the Si substrate is made possible without bending the member by using an electrode disposed in the entrance to the through hole so that the electroconductive film on the glass substrate has the same electrical potential as that of the Si substrate when the glass substrate is anode-bonded to the Si substrate.

However, the above disclosed in U.S. Pat. No. 4,384,899 has the following drawback. Since a through hole is formed on a glass substrate and since an electroconductive film must be formed in the through hole, it is difficult to manufacture very small elements.

The following is disclosed in U.S. Pat. No. 4,875,134. When the flat surface of a Si substrate having a surface formed of a recessed region on which a membrane is formed and a flat surface surrounding the recessed membrane is anode-bonded to a glass substrate during manufacturing of capacitive type pressure sensors, prior to bonding, the region facing the membrane and the region facing the flat surface are divided by a glass wall at right angles to the bonding surface on the surface of the glass substrate opposite to the bonding surface. Further, Si is buried in the two recesses on the glass substrate divided by the glass wall up to the height of the glass wall. The glass substrate is anode-bonded to the flat surface of the Si substrate by applying a voltage between the Si substrate and a buried Si layer divided by the glass wall on the glass substrate in the region facing the flat surface of the Si substrate.

However, U.S. Pat. No. 4,875,134 has the following drawbacks. It is necessary to perform several processes to form a recessed portion formed of a glass wall on the glass substrate and to form a Si layer up to the height of the glass wall. Furthermore, it is difficult to form the Si layer when the area of the membrane is made very small.

SUMMARY OF THE INVENTION

It is an object of the present invention to provide a selective anode bonding method and an entire-surface anode bonding method, in which the above-mentioned problems are solved.

It is another object of the present invention to provide an anode bonding method capable of preventing destruction or the like due to strain or tension caused by the bending moment of a bonded member after anode bonding.

It is a further object of the present invention to provide an acceleration sensor obtained by using an anode bonding method.

It is still a further object of the present invention to provide an anode bonding method for bonding a first substrate to a second substrate, both of which has a recessed portion, the method comprising the steps of: heating the first and second substrates in a stacked state; and bonding the substrates by applying a voltage between the first and second substrates.

An anode bonding method in accordance with a preferred embodiment of the present invention comprises the steps of: heating first and second substrates in a stacked state; and bonding the substrates by applying a voltage between them.

According to a first aspect of the present invention, there is provided an anode bonding method comprising the steps of: forming a recessed portion corresponding to the junction region opposite to the bonding surface of the first substrate so that the first substrate in the junction region is formed to a thickness smaller than that in a non-bonding region; forming an electrode in the recessed portion; heating the first and second substrates in a stacked state; and bonding the substrates by applying a voltage between them, so that regions which should be bonded between the two substrates are selectively bonded.

According to a second aspect of the present invention, there is provided an anode bonding method comprising the steps of: forming a recessed portion which gradually inclines toward the center of the opposite surface opposite to the bonding surface of a first substrate; forming an electrode in the recessed portion; heating a first and a second substrate to a predetermined temperature in a stacked state; and applying a voltage between the substrates.

According to a third aspect of the present invention, there is provided an anode bonding method comprising the steps of: forming an electrode on a region of a first substrate, which should not be bonded, or on the surface opposite to the region which should not be bonded; heating a first and a second substrate to a predetermined temperature in a stacked state; and applying a voltage between the first and second substrates while maintaining the electrode and the second substrate at the same electrical potential, so that the regions to be bonded between the two substrates are selectively bonded.

According to another aspect of the present invention, an acceleration sensor obtained by using the above-described anode bonding methods is provided.

In the present invention, when, for example, a glass substrate is anode-bonded to a conductor, the glass substrate is made thin in the bonding portion and thick in the non-bonding portion, making it possible for an electrostatic attracting force acting between bonded members when the same voltage is applied to exert a large or small attraction, respectively. As a result, the present invention has the advantage of being capable of bonding only selected portions.

When anode bonding is performed between a glass substrate and a conductor over the entire surface, the glass substrate is made thin near the center of the bonded surface and thick in the outer peripheral portion thereof (that is, the glass substrate is formed to be recessed), making it possible for the electrostatic attracting force acting between the bonded members to become largest near the center of the bonded surface, extending radially, and gradually smaller toward the outer peripheral portion, and causing bonding to gradually and continuously take place from the center toward the outer peripheral portion. Therefore, the present invention has the advantage of preventing bonding variations.

When a glass substrate is anode bonded to a Si substrate, an electrode is formed on the surface of the glass substrate in a portion which should not be bonded, and anode bonding is performed while maintaining the electrical potential between the electrode and the Si substrate at zero. Thus, it is possible to select non-bonding and bonding portions at will.

When a glass substrate is anode bonded to a Si substrate, both of which have a recessed groove as desired, when the recessed groove is made a non-bonding portion and the other flat portion is made a bonding portion, an electrode or an electrode film, such that the section between the glass substrate and the Si substrate is maintained at the same electrical potential, is formed on the surface of the glass substrate in the non-bonding portion, preventing elements from being destroyed because of strain or tension due to the bending moment of a bonding member after anode bonding. In addition, the anode bonding method of the present invention can be applied to manufacture very small devices such as acceleration sensors, and it is possible to manufacture such very small devices with a high degree of accuracy.

According to the present invention, an acceleration sensor is provided, including a weight; and detecting means for detecting an acceleration applied to the weight on the basis of variations in the electrical resistance of a fixed sensor formed of photoconductive thin films by a method in which a slit having a minor axis and a major axis at right angles to a normal line of the weight surface, passing through the center of gravity of the weight or near the weight, and a movable element having one end of a plate spring for supporting the weight at two places in the outer peripheral end of the weight, which is point symmetric with respect to the center of gravity or a point close to the weight, the other end of the plate spring on a Si substrate at an angle of 225 degrees from the one end of the plate spring abut the center of gravity or the point close to the weight, that is, for supporting the weight by the two plate springs, are formed integrally on the Si substrate; a slit is formed without the surface of a light-shielding thin film on an optical axis passing through the slit after the light-shielding thin film is formed on one or both surfaces of one of the glass substrates, the light-shielding thin film is formed on one surface of the other glass substrate, a thin film which is photoconductive to incident light from the slit formed in the weight on the other surface, that is, a fixed sensor formed of the photoconductive thin film formed in such a form as to cause variations in the electrical resistance in accordance with the displacement of the slit formed on the Si substrate, caused by acceleration, are formed; and the two glass substrates are bonded by using the bonding-portion selective anode bonding method stated in claim 1 in such a way that said two glass substrates face each other with the Si substrates being sandwiched therebetween.

In the present invention, examples of bonding substrates are an insulating substrate, an electroconductive substrate, and a semiconductor substrate. Concrete examples are a glass substrate and a silicon substrate. It is preferable that a substrate such that impurity ions present on the surface are easy to move, as in a glass substrate, be used for one of the substrates. Examples of such substrates are a substrate having ion implantation performed on the surface of a ceramic. The temperature at which two substrates are stacked on one another and heated depends on the selected substrate, but it is generally from 100° to 600° C., more preferably from 200° to 500° C., and most preferably from 300° to 400° C.

The voltage to be applied between two substrates is preferably a DC voltage. It is generally from 20 to 400 V, more preferably from 50 to 300 V, and most preferably from 100 to 200 V.

In the present invention, electroconductive members may be used as electrodes, though electrodes are preferably formed of deposited films, foil films, or conductors of flat plates. Usable materials for the electrodes are Al, Au, Mo, W, Cr, Si, ITO (Indium Tin Oxide) or the like.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Figure 1:
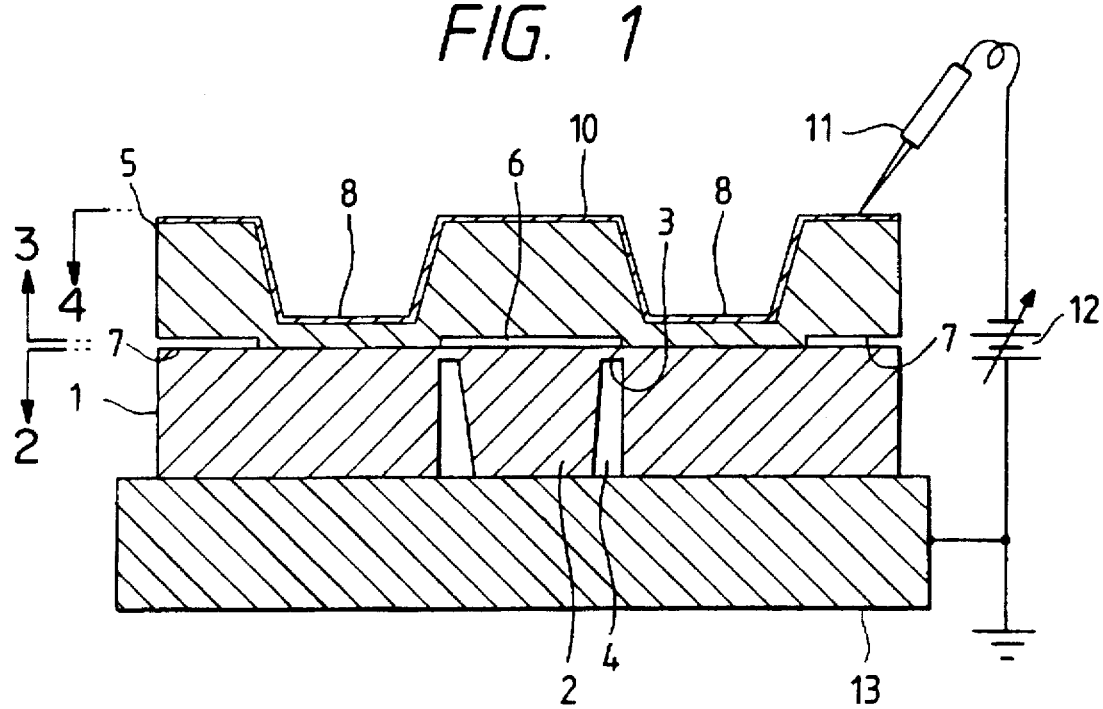
FIG. 1 is a schematic view illustrating an example of an anode bonding method in accordance with the present invention.
Figure 2:
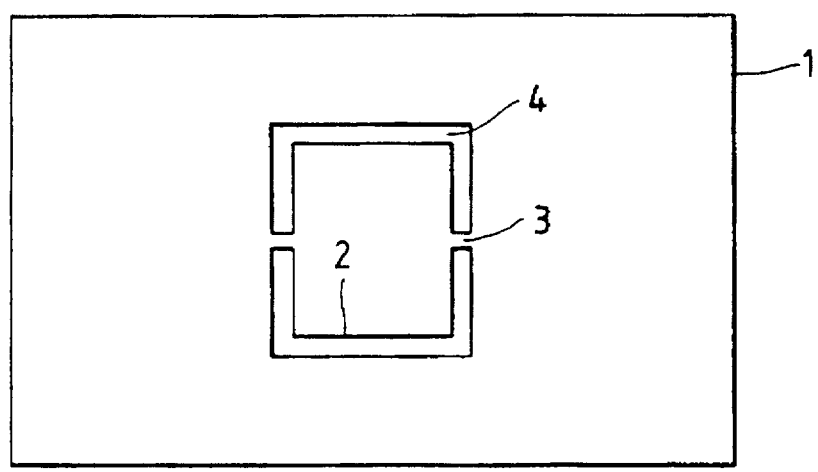
FIG. 2 is a sectional, plan view taken in the direction of the arrow 2A of FIG. 1.
Figure 3:
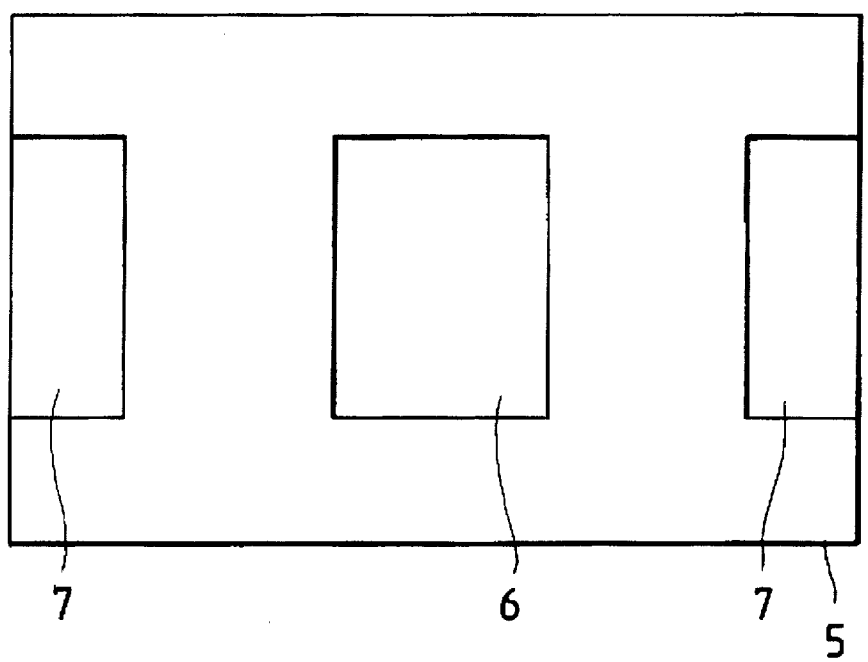
FIG. 3 is a sectional, plan view taken in the direction of the arrow B of FIG. 1.
Figure 4:
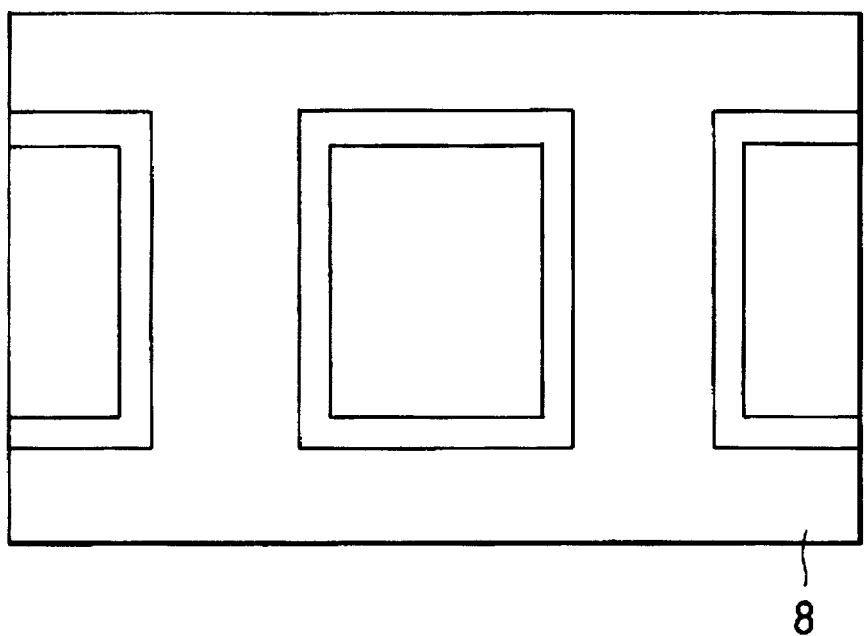
FIG. 4 is a sectional, plan view taken in the direction of the arrow 4C of FIG. 1.
Figure 5:
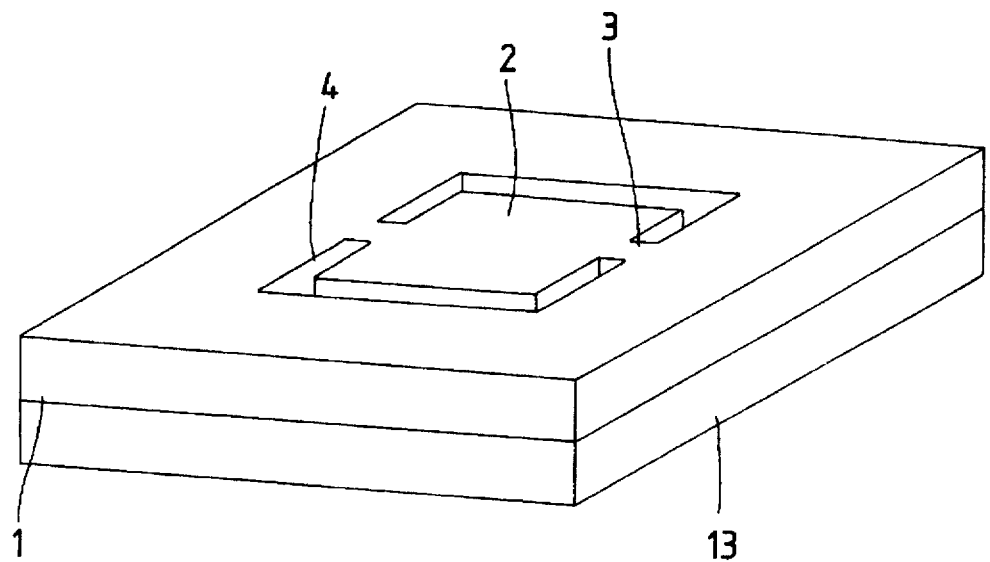
FIG. 5 is a perspective view illustrating a state in which a second substrate of FIG. 1 is removed.

Preferred embodiments will be explained below with reference to the accompanying drawings.

[First Embodiment]

FIGS. 1 to 5 show the first embodiment of the present invention.

In these figures, reference numeral 1 denotes a Si substrate; reference numeral 2 denotes a pendulum formed on the Si substrate 1; reference numeral 3 denotes a shaft beam (a rectangular parallelopiped beam: 10 μm long and 15 μm wide) which serves as the center of the circular arc movement of the pendulum 2 formed on the Si substrate 1; reference numeral 4 denotes an air gap formed on the Si substrate 1; reference numeral 5 denotes a glass substrate; reference numeral 6 denotes an enclosed groove, having a depth of 3 μm, formed in a portion of the glass substrate 5 which should not be bonded; reference numeral 7 denotes a recessed groove, having a depth of 3 μm, formed in the portion which should not be bonded in the same manner as in the enclosed groove 6; reference numeral 8 denotes a groove (thickness up to the bonding surface is 0.2 mm) formed in the glass substrate 5 in a portion thereof which should be bonded; reference numeral 10 denotes an electrode formed of an electroconductive film formed on the surface of the glass substrate 5 opposite to the bonding surface in order to apply a voltage during anode bonding; reference numeral 11 denotes a needle electrode; reference numeral 12 denotes a DC power supply; and reference numeral 13 denotes a platen 13 with a heater.

In the above-described construction, alignment between the portions which should be bonded and not bonded is performed for the Si substrate 1 and the glass substrate 5 before the Si substrate 1 is bonded to the glass substrate 5. More specifically, the Si substrate 1 and the glass substrate 5 are brought into abutment with each other so that the pendulum 2 which serves as a movable element, formed in the Si substrate 1, faces the enclosed groove 6 formed in the glass substrate 5. Then, the needle electrode 11 is electrically connected to the electrode 10 in a state in which a bonded member is heated and maintained at 400° C. by the platen 13, and a voltage of 150 V is applied by the DC power supply 12 so that the Si substrate 1 and the glass substrate 5 act as the anode and the cathode, respectively. As a result of the above operation, the electric-field intensity between the portions which should be bonded, that is, the glass surface of the groove 8 and the surface of the Si substrate, is larger than that between those which should not be bonded. Therefore, when the glass substrate is anode bonded to the Si substrate 1, bonding is caused to take place in a portion of the groove 8 where the largest electric-field intensity occurs as the voltage is gradually increased by the DC power supply 12. When the voltage applied between the glass substrate 5 and the Si substrate 1 is maintained constant when bonding occurs in a portion which should be bonded by the above-described operation, it is possible to prevent bonding between the grooves 6 and 7 (between the Si substrate 1 and the glass substrate 5). Thus, it is possible to anode bond only selected portions by using a difference between the above-described electric fields.

Although in this embodiment the bonded member is heated at 400° C., the heating is not limited to this temperature.

[Second Embodiment]

Figure 6:
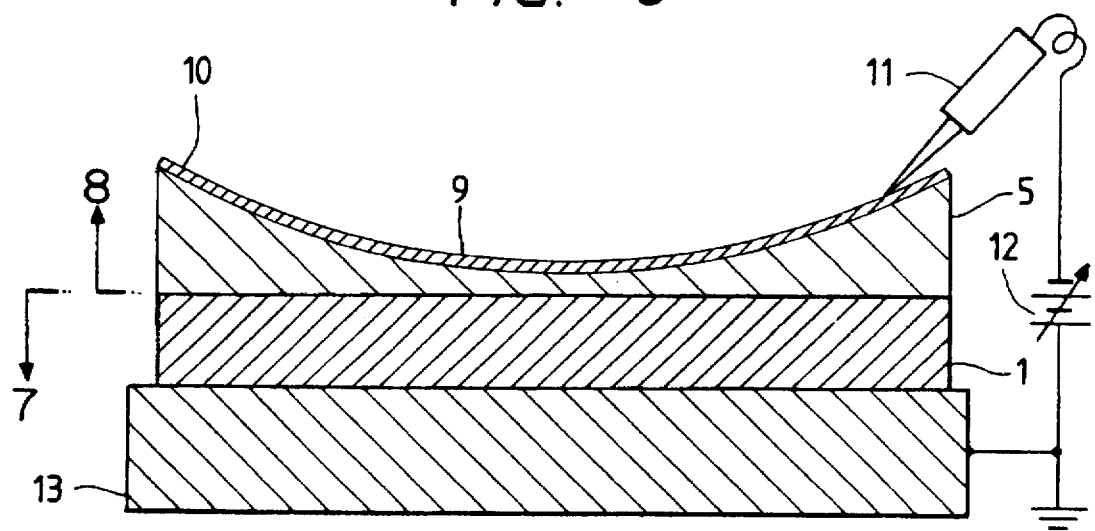
FIG. 6 is a schematic view illustrating an example of an anode bonding method in accordance with the present invention.
Figure 7:
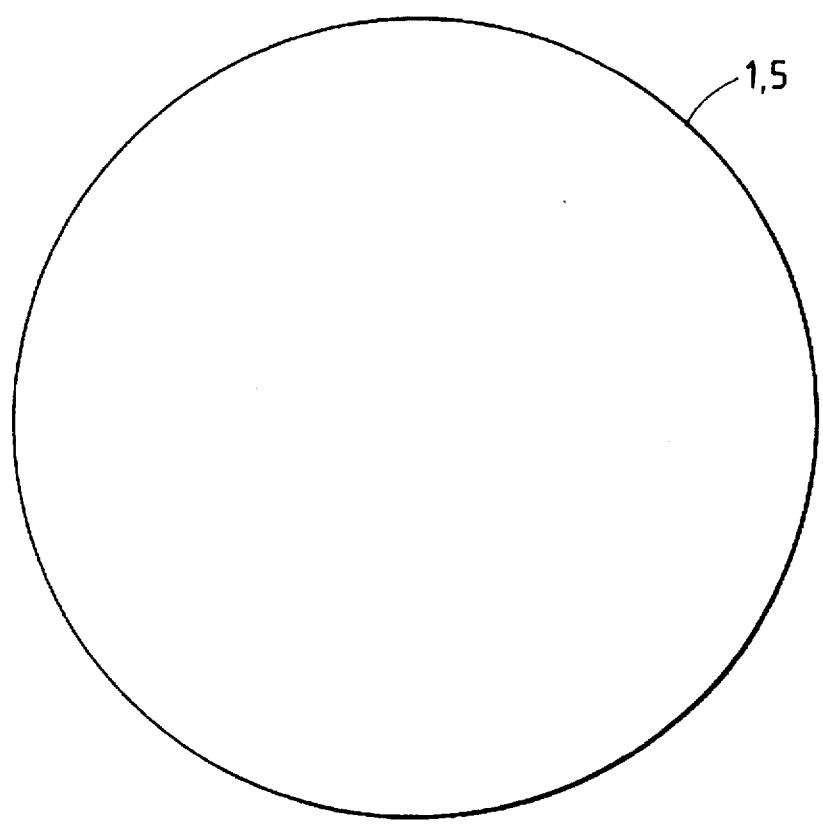
FIG. 7 is a sectional, plan view taken in the direction of the arrow E of FIG. 6.

FIGS. 6 and 7 show a second embodiment of the present invention. In these figures, reference numeral 1 denotes a Si substrate; reference numeral 5 denotes a glass substrate; reference numeral 9 denotes a recessed groove which is thinnest near the center of the glass substrate 5 and thickest in the outer periphery thereof; reference numeral 10 denotes an Al thin-film electrode formed on the surface of the groove 9 on the glass substrate 5; reference numeral 11 denotes a needle electrode which is electrically connected to the Al thin-film electrode 10; reference numeral 12 denotes a DC power supply for applying a voltage between the glass substrate 5 and the Si substrate 1; and reference numeral 13 denotes a platen with a heater.

In the above-described construction, when the Si substrate 1 is bonded to the glass substrate 5, initially the surface of the Si substrate 1 is brought into abutment with the surface of the glass substrate 5 opposite to the groove 9. Then, a voltage of 100 V is applied by the DC power supply 12 while heating and maintaining the bonded member at 400° C. by the platen 13 with a heater, so that the Si substrate 1 and the glass substrate 5 act as the anode and the cathode, respectively, and then the voltage is gradually increased to 200 V by operating the DC power supply 12. Therefore, the intensity of the electric field caused between the bonded surface of the glass substrate 5 and the Si substrate 1 becomes largest near the center of the groove 9. Since the electrostatic attracting force increases as the electric-field intensity increases, bonding is caused to take place first near the center of the groove 9 by the electrostatic attracting force. As the applied voltage is gradually increased, the bonding progresses from the center of the bonding substrate to the outer periphery thereof. According to the above-described bonding method, bonding takes place first in the central portion of the bonded member, and progresses gradually toward the outer periphery. Therefore, it is possible to prevent the bonding from being omitted in the central portion. As a result, it is possible to easily perform bonding uniformly over the entire surface.

[Third Embodiment]

Figure 8:
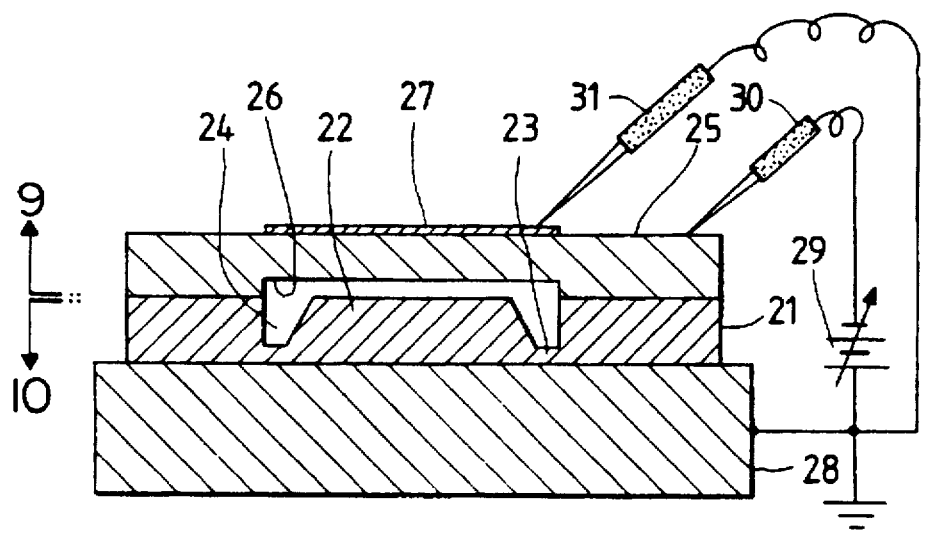
FIG. 8 is a schematic view illustrating an example of an anode bonding method in accordance with the present invention.
Figure 9:
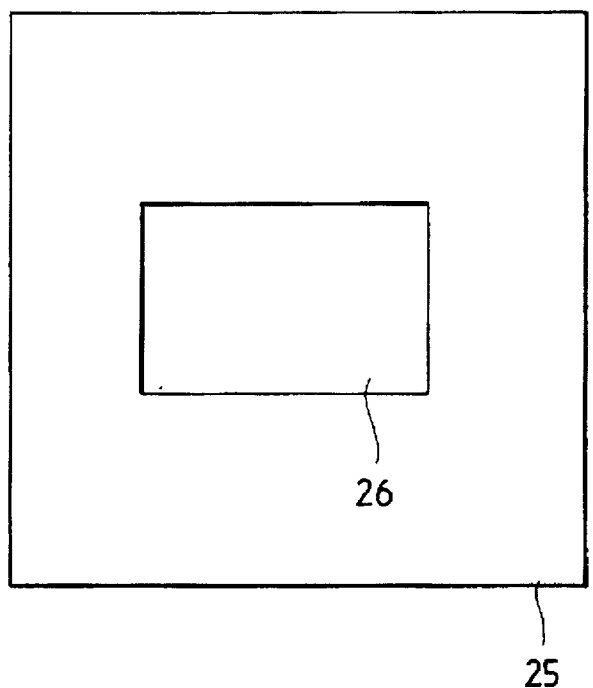
FIG. 9 is a sectional, plan view taken in the direction of the arrow 9A of FIG. 8.
Figure 10:
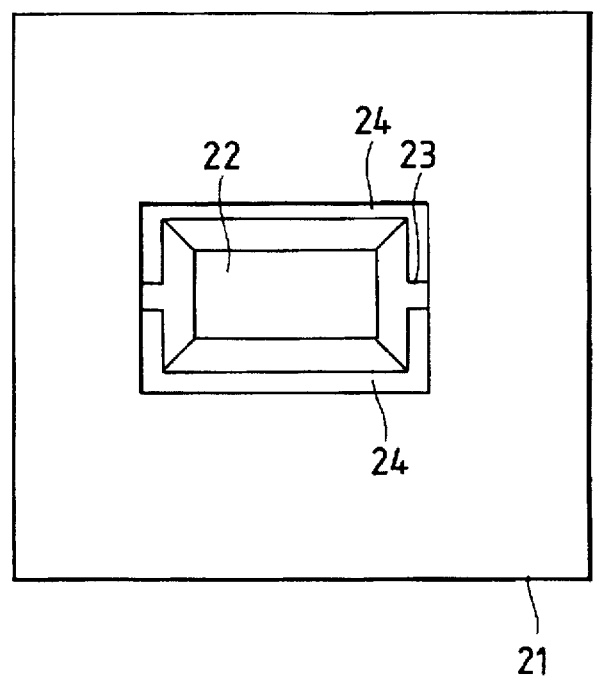
FIG. 10 is a sectional, plan view taken in the direction of the arrow 10B of FIG. 8.

FIGS. 8 to 10 show the third embodiment of the present invention.

FIG. 8 is a view best illustrating the features of the present invention. FIGS. 9 and 10 are views taken in the direction of the arrows 9A and 10B of FIG. 8, respectively. In these figures, reference numeral 21 denotes a Si substrate to be bonded; reference numeral 22 denotes a pendulum which moves in a circular arc, formed on the Si substrate 21; reference numeral 23 denotes a shaft beam of the pendulum 22; reference numeral 24 denotes an air gap; reference numeral 25 denotes a glass (Pyrex #7740) substrate; reference numeral 26 denotes a recessed groove having a depth of 3 μm, formed on the glass substrate 25; reference numeral 27 denotes a ground electrode which is electrically connected to the surface of the glass substrate 25, directly above the groove 26 (non-bonding portion when the Si substrate 21 is anode bonded to the glass substrate 25), the ground electrode having the same size and shape as those of the groove 26; reference numeral 28 denotes a platen with a heater; reference numeral 29 denotes a DC power supply used for anode bonding; reference numeral 30 denotes a needle electrode which is in contact with and electrically connected to the surface of the glass substrate 25; and reference numeral 31 denotes a needle electrode which is in contact with and electrically connected to the surface of the ground electrode 27.

In the above-described construction, bonding of the two substrates 22 and 25 will be explained. Initially, the Si substrate 21 and the glass substrate 25 are heated to 400° C. by a platen 28, and then a voltage is applied between the Si substrate 21 and the glass substrate 25 by the DC power supply 29 through the needle electrode 30. At the same time, the ground electrode 27 is set at the same electrical potential as the Si substrate 21 through the needle electrode 31. That is, in this embodiment, the ground electrode 27 is grounded. When the DC power supply 29 is maintained at 200 V for 10 minutes in this condition, all portions other than those portions which should not be bonded, i.e., other than the groove 26, were bonded as desired. In the process of this anode bonding, no bonding takes place between the pendulum 22 and the glass groove 26, nor the shaft beam 23 which should act as a movable element breaks, and bonding as expected is possible. That is, the advantage is obtained that an electrostatic attracting force does not act between the glass groove 26 and the pendulum 22 due to the ground electrode 27. According to this method, it is possible to bond the section between the Si substrate 21 having the pendulum 22, the size of the shaft beam 23 thereof being extremely small (10 μm long and 15 μm wide), and the glass substrate 25 without destroying the elements. Although a thin-film glass plate around which an aluminum foil wound is used for the ground electrode 27, an aluminum foil does not have to be used for the ground electrode 27, but an electroconductive film (e.g., Al, Au, Mo, W, Gr or Si thin film, or ITO transparent film) which acts as an ground electrode may be used. For a formation method, a deposition method or the like may be used.

[Fourth Embodiment]

Figure 11:
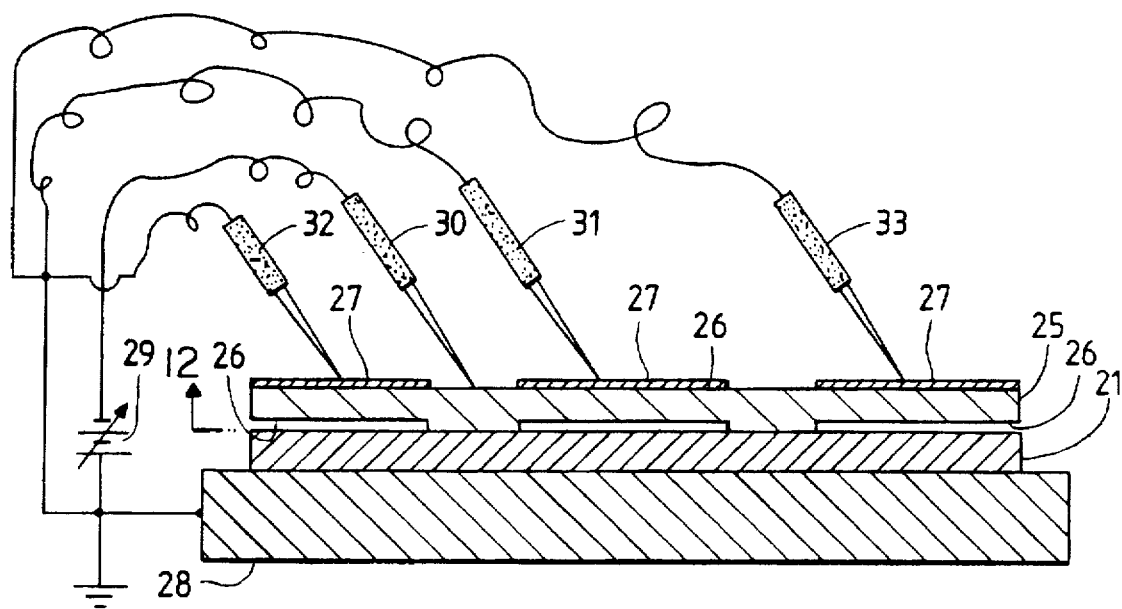
FIG. 11 is a schematic view illustrating an example of an anode bonding method in accordance with the present invention.
Figure 12:
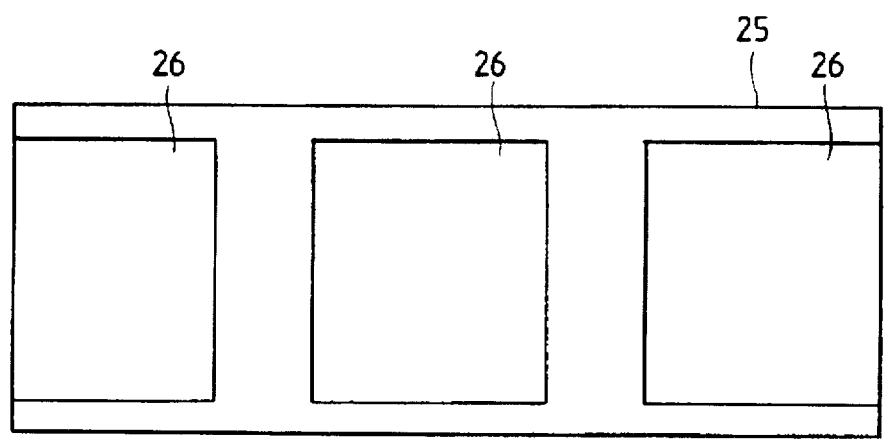
FIG. 12 is a sectional, plan view taken in the direction of the arrow 12C of FIG. 11.

FIGS. 11 and 12 show the fourth embodiment of the present invention. FIG. 11 is a view best illustrating the features of the embodiment of the present invention. FIG. 12 is a view taken in the direction of the arrow 12C of FIG. 11. In these figures, reference numeral 21 denotes a Si substrate; reference numeral 25 denotes a glass substrate having a groove 26, 3 μm deep; reference numeral 27 denotes a ground electrode which is electrically connected to the surface of the glass substrate 25 directly above the groove 26 (non-bonding portion when the Si substrate 21 is anode bonded to the glass substrate 25), the ground electrode having the same size and shape as those of the groove 26; reference numeral 28 denotes a platen with a heater; reference numeral 29 denotes a DC power supply used for anode bonding; reference numeral 30 denotes a needle electrode which is in contact with and electrically connected to the surface of the glass substrate 25; and reference numerals 31, 32 and 33 denote needle electrodes which are in contact with and electrically connected to the surface of the ground electrode 27.

In the above-described construction, a voltage is applied between the Si substrate 21 and the glass substrate 25 by the DC power supply 29 through the needle electrode 30 while the Si substrate 21 and the glass substrate 25 are being heated to and maintained at 400° C. by the platen 28. At the same time, the ground electrode 27 is set at the same electrical potential as that of the Si substrate 21 through the needle electrode 31. That is, the ground electrode 27 is grounded in this embodiment. When the DC power supply 29 is maintained at 200 V for 10 minutes in this condition, the substrate 21 is bonded at all flat surfaces other than those portions which should not be bonded, i.e., other than the groove 26.

When the operation is performed in a manner similar to the above except that the ground electrode 27, and the needle electrodes 31, 32 and 33 are not used, bonding unavoidably takes place in the groove 26 which should not be bonded during the anode bonding between the Si substrate and the glass substrate. That is, bonding occurs in a portion which should not be bonded. For this reason, the glass substrate 25 is warped to assume a wave form, as a result, a phenomenon occurs simultaneously by which bonding is impossible in a portion which should be bonded.

Therefore, by using the ground electrode, it is possible to select portions which should not be bonded or should be bonded beforehand, that is, selective bonding is possible.

[Fifth Embodiment]

Figure 13:
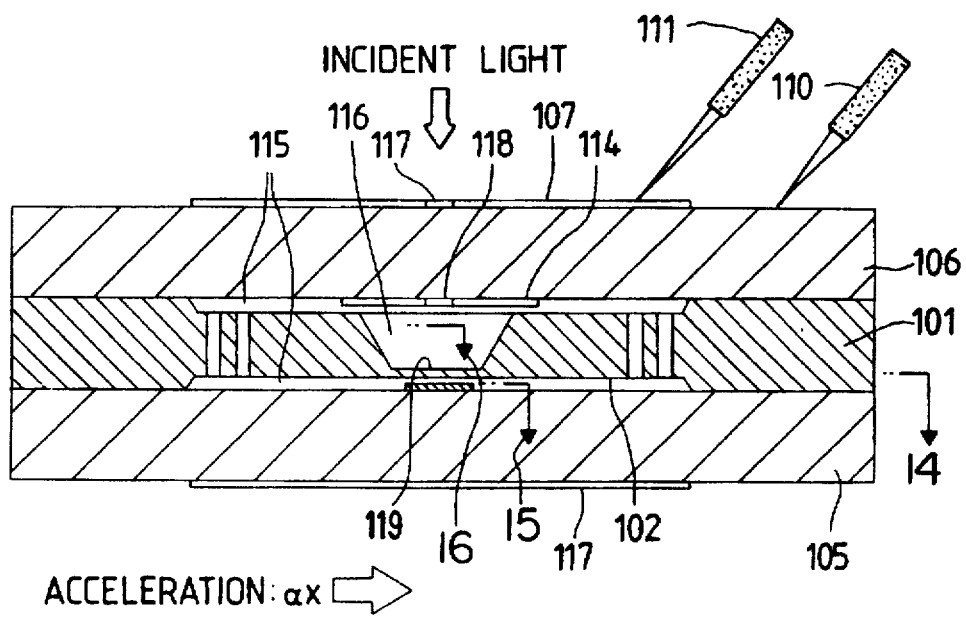
FIG. 13 is a schematic view illustrating an example of an anode bonding method in accordance with the present invention.
Figure 14:
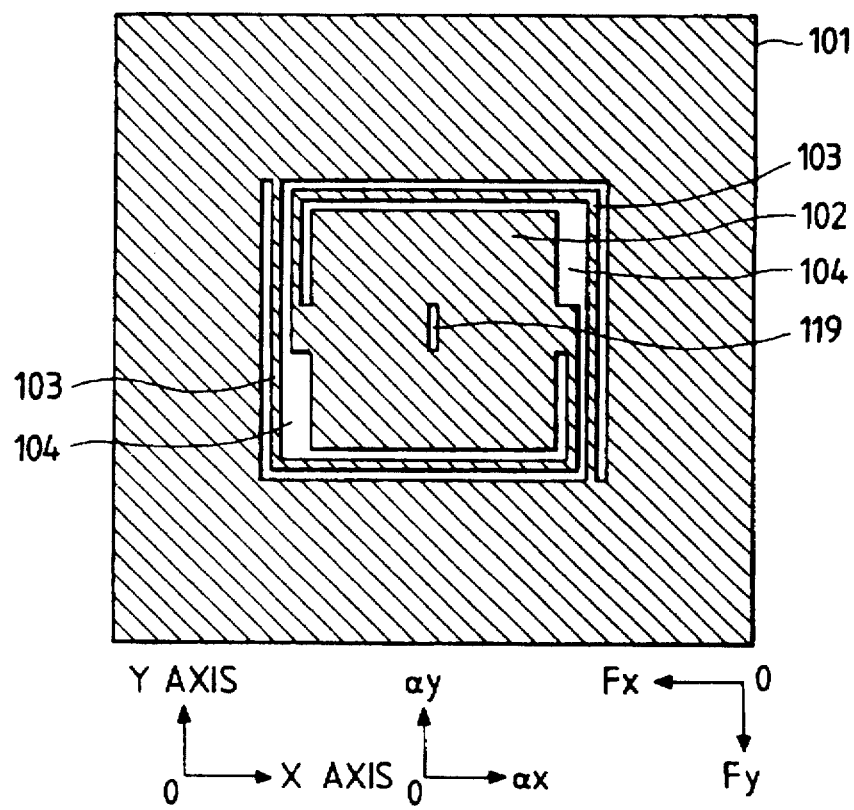
FIG. 14 is a sectional, plan view taken in the direction of the arrow 14D of FIG. 13.
Figure 15:
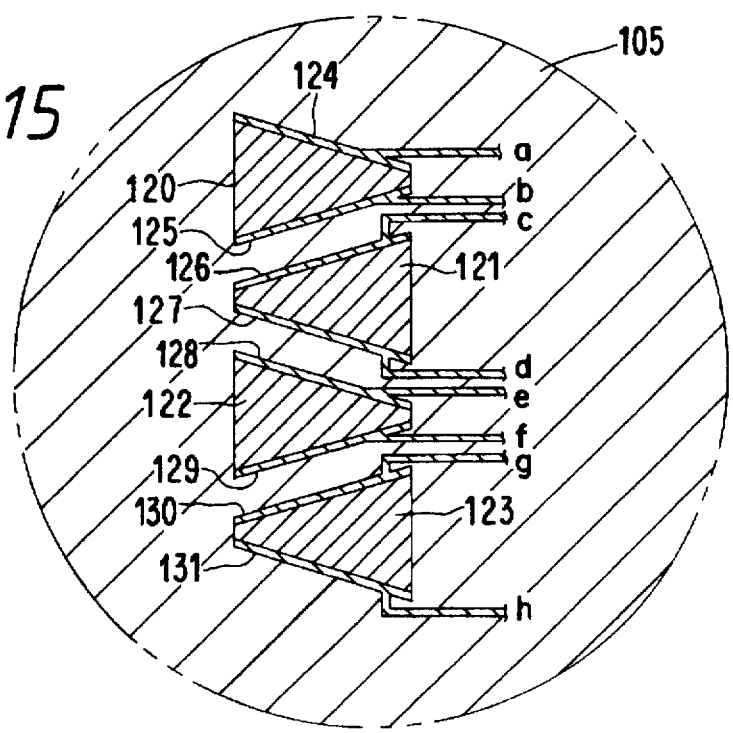
FIG. 15 is a sectional, plan view taken in the direction of the arrow 15F of FIG. 13.
Figure 16:
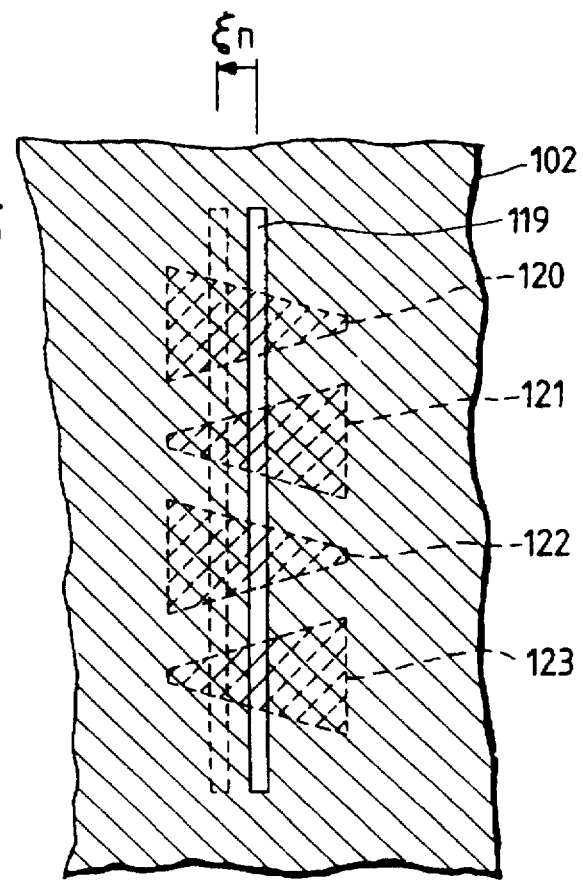
FIG. 16 is a view taken in the direction of the arrow 16E of FIG. 13.
Figure 17:
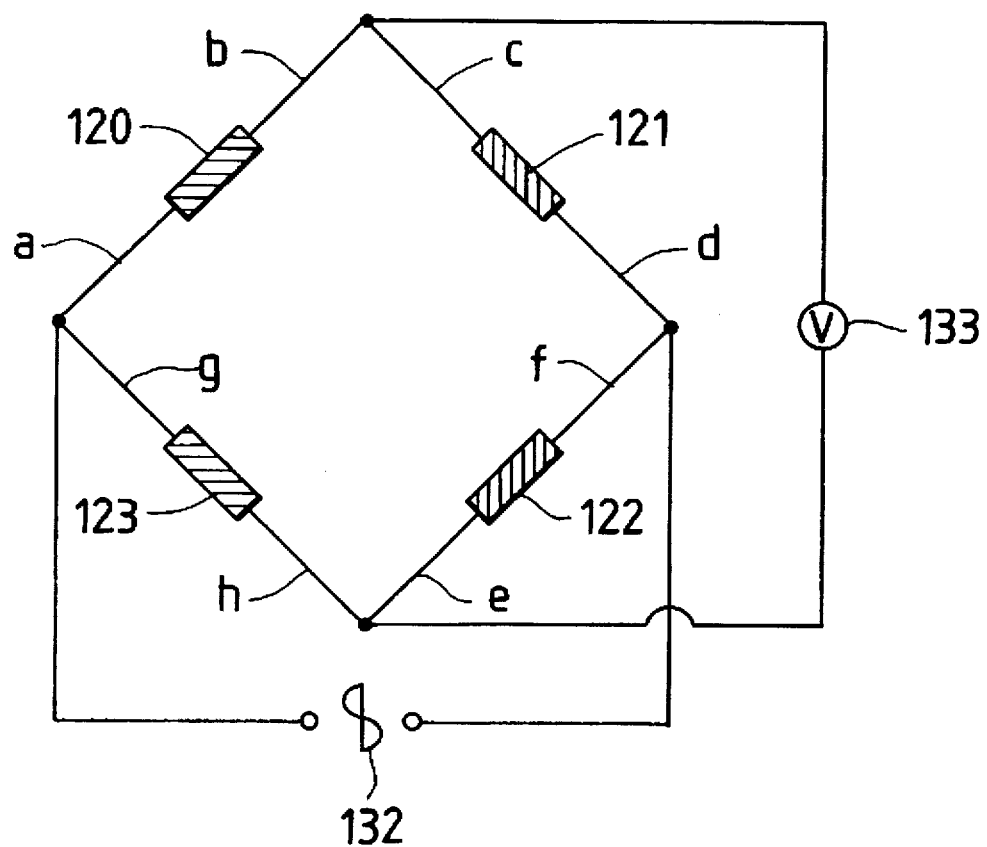
FIG. 17 illustrates pickup of signals.

FIGS. 13 to 17 show the fifth embodiment of the present invention. FIG. 13 is a view best illustrating the features of the present invention. FIG. 14 is a view taken in the direction of the arrow 14D of FIG. 13. FIG. 15 is a view taken in the direction of the arrow 15F of FIG. 13. FIG. 16 is a view taken in the direction of the arrow 16E of FIG. 13. FIG. 17 illustrates pickup of signals. In these figures, reference numeral 101 denotes a Si substrate; reference numeral 102 denotes a weight portion formed on the Si substrate 101; reference numeral 103 denotes a plate spring portion which forms a beam of the weight portion 102; reference numeral 104 denotes an air gap which occurs when the weight portion 102 and the plate spring portion 103 are formed; and reference numerals 105 and 106 denote a first and a second glass substrate (Pyrex #7740), respectively.

Reference numeral 107 denotes a ground electrode which is electrically connected to the surface of the second glass substrate 106 directly above a groove 115 which is not bonded when the Si substrate 101 is anode bonded to the second glass substrate 106 (the Si substrate 101 is bonded to the first glass substrate 105 and then the second glass substrate 106 is anode bonded to the Si substrate 101). The ground electrode 107 has the same size and shape as those of the groove 115. Reference numeral 110 denotes a needle electrode which is in contact with and electrically connected to the surface of the second glass substrate 106; reference numeral 111 denotes a needle electrode which is in contact with and electrically connected to the surface of the ground electrode 107; reference numeral 114 denotes a metallic thin film (deposited Al film) for shielding light, formed beneath the second glass substrate 106; reference numeral 115 denotes a groove, which is a movable portion and should not be bonded when the Si substrate 101 is bonded to the first glass Substrates 105 and 106, that is, the groove 115 is provided on the Si substrate 101 so that the weight portion 102 and the plate spring portion 103 are not bonded to the glass substrate; reference numeral 116 denotes a deep groove disposed in the central portion of the weight portion 102.

Reference numeral 117 denotes a second elongated slit for receiving light on the top surface of the second glass substrate 106, which slit is formed in the central portion of the ground electrode 107 on the surface thereof opposite to the metallic thin film 114; reference numeral 118 denotes a small elongated slit for receiving light formed in the central portion of the metallic thin film 114; reference numeral 119 denotes a first elongated slit for receiving light formed in the central portion of the weight portion 102, the slits 117, 118 and 119 being positioned so as to make the optical axes of the incident light coincide with each other. In FIG. 15, reference numerals 120, 121, 122 and 123 denote photoconductive thin films (CdS), respectively; and reference numerals 124, 125, 126, 127, 128, 129, 130 and 131 denote electrodes formed of conductors. In FIG. 17, reference numeral 132 denotes an AC power supply; and reference numeral 133 denotes a voltmeter for detecting an output when a bridge circuit is formed by the photoelectric conversion thin films 120, 121, 122 and 123. In FIGS. 15 and 16, reference letters "a" to "h" denote terminals of the photoelectric conversion thin films 120, 121, 122 and 123, respectively.

In the above-described construction, when an acceleration $\alpha_x$ parallel to the paper surface as shown in FIG. 13 occurs, the weight portion 102 receives a force F described below:

$$F=m\alpha \quad (1)$$

where F is the force that the weight portion 102 receives, m is the weight of the weight portion 102, $\alpha$ is the acceleration that the weight portion receives, the force F that the weight portion 102 receives acting in a direction opposite to the acceleration $\alpha_x$ that the weight portion receives. Thus, as shown in FIG. 14, a displacement $\xi_x$ of the weight portion 102 occurs in the direction of the force $F_x$ by the force $F_x$ caused in the weight portion 102 due to the acceleration $\alpha_x$:

$$F_x=k_x\xi_x \quad (2)$$

where $k_x$ is the spring constant of the plate spring portion 103 caused by the displacement along the X axis in FIG. 14. Therefore, as a result of the slit 119 formed in the weight portion 102 being displaced by $\xi_x$ along the X axis as shown in FIG. 16, the electrical resistance of the photoconductive thin films 120 and 122 becomes larger and that of the photoconductive thin films 121 and 123 becomes smaller. Therefore, an output voltage of the bridge circuit formed by the photoconductive thin films 120, 122, 123 and 124 in FIG. 17 increases as the acceleration $\alpha_x$ increases, as described below:

$$V_x \propto \alpha_x \quad (3)$$

where $V_x$ is the output voltage generated by the acceleration $\alpha_x$.

It is possible to determine the acceleration $\alpha_{xy}$ in the X-Y plane by using the above-mentioned two acceleration sensors, more specifically, by simultaneously detecting the acceleration $\alpha_x$ along the X axis and the acceleration $\alpha_y$ along the Y axis. The acceleration $\alpha_{xy}$ is expressed as follows:

$$\alpha_{xy}=(\alpha_x^2+\alpha_y^2)^{1/2} \quad (4)$$

In this embodiment, when a weight portion of 6 mm×6 mm×0.5 mm and a spring plate having a cross section of 0.1 mm×0.5 mm are formed on a Si substrate having a thickness of 0.53 mm, the output voltage varies by approximately 200 mV when the acceleration $\alpha_x$ along the X axis is 10 G.

Although in the above-described embodiments sensors constructed as described above are used to detect variations in the amount of light, various optical sensors may be used instead of the above sensors. In addition, a voltage can be detected by a circuit other than the above-described circuit.

According to the present invention, as described above, when, for example, a glass substrate is anode-bonded to a conductor, the glass substrate is made thin in the bonding portion and thick in the non-bonding portion, making it possible for an electrostatic attracting force acting between bonded members when the same voltage is applied to exert a large or small attraction, respectively. As a result, the present invention has the advantage of being capable of bonding only selected portions.

When anode bonding is performed between a glass substrate and a conductor over the entire surface, the glass substrate is made thin near the center of the bonded surface and thick in the outer peripheral portion thereof (that is, the glass substrate is formed to be recessed), making it possible for the electrostatic attracting force acting between the bonded members to become largest near the center of the bonded surface, extending radially, and gradually smaller toward the outer peripheral portion, and causing bonding to gradually and continuously take place from the center toward the outer peripheral portion. Therefore, the present invention has the advantage of preventing bonding variations.

When a glass substrate is anode bonded to a Si substrate, an electrode is formed on the surface of the glass substrate in a portion which should not be bonded, and anode bonding is performed while maintaining the electrical potential between the electrode and the Si substrate at zero. Thus, it is possible to select non-bonding and bonding portions at will.

When a glass substrate is anode bonded to a Si substrate, both of which have a recessed groove as desired, when the recessed groove is made a non-bonding portion and the other flat portion is made a bonding portion, an electrode or an electrode film, such that the section between the glass substrate and the Si substrate is maintained at the same electrical potential, is formed on the surface of the glass substrate in the non-bonding portion, preventing elements from being destroyed because of strain or tension due to the bending moment of a bonding member after anode bonding. In addition, the anode bonding method of the present invention can be applied to manufacture very small devices such as acceleration sensors, and it is possible to manufacture such very small devices with a high degree of accuracy.

Although the present invention has been described with respect to what is considered to be the preferred embodiments, it is understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An anode bonding method comprising the steps of:
    forming a recessed portion corresponding to a junction region opposite to a bonding surface of a first substrate so that a thickness of said first substrate in the junction region is thinner than that in a non-bonding region;
    forming an electrode in said recessed portion;
    heating said first and a second substrate in a stacked state; and
    bonding the first and second substrates by applying a voltage between said electrode and said second substrate, so that regions which should be bonded between the two substrates are selectively bonded.

2. An anode bonding method according to claim 1, wherein said first substrate is glass.

3. An anode bonding method according to claim 1, wherein said electrode is formed on an end surface of the recess.

4. An anode bonding method according to claim 1, wherein said second substrate is an electroconductive substrate or a semiconductor substrate.

5. An anode bonding method according to claim 1, wherein a depth of the recess of the recessed portion is greater at a center of the recess portion than at a periphery thereof.

6. An anode bonding method comprising the steps of:
    forming a recessed portion on a surface opposite to a bonding surface of a first substrate whose thickness is the thinnest at a center and thickest in the outer periphery thereof;
    forming an electrode on a surface opposite to the bonding surface;
    heating the first substrate and a second substrate to a predetermined temperature in a stacked state; and
    applying a voltage between the first and second substrates.

7. An anode bonding method according to claim 6, wherein said first substrate is glass.

8. An anode bonding method according to claim 6, wherein said electrode is formed on the end surface of the recess.

9. An anode bonding method according to claim 6, wherein bonding is performed by increasing said applied voltage.

10. An anode bonding method comprising the steps of:
    forming an electrode on a surface opposite to a bonding surface in a region of a first substrate directly above a groove;
    heating the first substrate and a second substrate to a predetermined temperature in a stacked state; and
    applying a voltage between the first and second substrates while maintaining the electrode and the second substrate at the same electrical potential, so that the regions to be bonded between the two substrates are selectively bonded.

11. An anode bonding method according to claim 10, wherein said first substrate is glass.

12. An anode bonding method according to claim 1, wherein the electrode is a conductor formed of deposited films, foil films, or conductors of flat plates.

13. An anode bonding method according to claim 12, wherein the materials of the electrodes are Al, Au, Mo, W, Cr, Si, or ITO.

* * * * *

UNITED STATES PATENT AND TRADEMARK OFFICE
CERTIFICATE OF CORRECTION

PATENT NO. : 5,673,476
DATED : October 7, 1997
INVENTOR(S) : MASATAKE AKAIKE ET AL.

It is certified that error appears in the above-identified patent and that said Letters Patent is hereby corrected as shown below:

On the title page
Item [56] OTHER PUBLICATIONS

In "Field Assisted Glass", "vol.," should read --vol. 40,--.

COLUMN 2

Line 63, "both" should read --each--.

COLUMN 5

Line 14, "2A" should read --2--.
Line 16, "B" should read --3--.
Line 26, "E" should read --7--.
Line 31, "9A" should read --9--.
Line 33, "10B" should read --10--.
Line 38, "12C" should read --12--.
Line 43, "14D" should read --14--.
Line 45, "15F" should read --15--.
Line 46, "16E" should read --16--.

COLUMN 8

Line 5, "wound" should read --is wound--.
Line 9, "as an" should read --as a--.

COLUMN 9

Line 26, "Substrates" should read --substrates--.

UNITED STATES PATENT AND TRADEMARK OFFICE
CERTIFICATE OF CORRECTION

PATENT NO. : 5,673,476
DATED : October 7, 1997
INVENTOR(S) : MASATAKE AKAIKE ET AL.

It is certified that error appears in the above-identified patent and that said Letters Patent is hereby corrected as shown below:

<u>COLUMN 11</u>

Line 43, "recess" should read --recessed--.

Signed and Sealed this

First Day of September, 1998

Attest:

BRUCE LEHMAN

*Attesting Officer*     *Commissioner of Patents and Trademarks*